(12) United States Patent
Bacquet et al.

(10) Patent No.: US 10,109,893 B2
(45) Date of Patent: Oct. 23, 2018

(54) SYSTEM AND CORRESPONDING METHOD FOR MANAGING A BATTERY COMPRISING A PLURALITY OF BATTERY CELLS

(71) Applicant: RENAULT S.A.S, Boulogne-Billancourt (FR)

(72) Inventors: Sylvain Bacquet, Chasselay (FR); Sylvain Leirens, Grenoble (FR); Michel Mensler, Montigny le Bretonneux (FR); Michael Palmieri, Grenoble (FR)

(73) Assignee: RENAULT S.A.S, Boulogne-Billancourt (FR)

( * ) Notice: Subject to any disclaimer, the term of this patent is extended or adjusted under 35 U.S.C. 154(b) by 87 days.

(21) Appl. No.: 15/115,411

(22) PCT Filed: Jan. 15, 2015

(86) PCT No.: PCT/FR2015/050093
§ 371 (c)(1),
(2) Date: Jul. 29, 2016

(87) PCT Pub. No.: WO2015/114234
PCT Pub. Date: Aug. 6, 2015

(65) Prior Publication Data
US 2017/0005372 A1    Jan. 5, 2017

(30) Foreign Application Priority Data
Jan. 30, 2014 (FR) ..................... 14 50728

(51) Int. Cl.
| | |
|---|---|
| *H01M 10/00* | (2006.01) |
| *H01M 10/48* | (2006.01) |
| *G01R 31/36* | (2006.01) |
| *H04Q 9/00* | (2006.01) |
| *H01M 10/42* | (2006.01) |

(52) U.S. Cl.
CPC .......... *H01M 10/48* (2013.01); *G01R 31/362* (2013.01); *G01R 31/3658* (2013.01); *H01M 10/425* (2013.01); *H01M 10/4207* (2013.01); *H04Q 9/00* (2013.01); *H01M 2010/4271* (2013.01); *H01M 2010/4278* (2013.01); *H01M 2220/20* (2013.01); *H04Q 2209/10* (2013.01); *H04Q 2209/30* (2013.01)

(58) Field of Classification Search
CPC .. H04Q 2209/10; H04Q 9/10; H04Q 2209/30; G01R 31/3658; H01M 2010/4278; H01M 2010/4271; H01M 10/48; H01M 10/425; H01M 10/4207; H01M 2220/20
See application file for complete search history.

(56) References Cited

U.S. PATENT DOCUMENTS

| | | | |
|---|---|---|---|
| 2009/0198399 A1* | 8/2009 | Kubo ................... | B60L 11/1855 701/22 |
| 2012/0161677 A1* | 6/2012 | Kunimitsu .......... | H01M 2/1077 318/139 |
| 2013/0130068 A1 | 5/2013 | Song et al. | |

FOREIGN PATENT DOCUMENTS

| | | |
|---|---|---|
| EP | 1 933 443 | 6/2008 |
| WO | WO2012/171919 | 12/2012 |

* cited by examiner

*Primary Examiner* — Cynthia H Kelly
*Assistant Examiner* — Monique M Wills
(74) *Attorney, Agent, or Firm* — Occhiuti & Rohlicek LLP

(57) ABSTRACT

A system for managing a battery having a plurality of battery cells connected in series, a plurality of control circuits connected in parallel with a battery cell and at least one electrical connection between a first control circuit of a first cell and a second control circuit of a second cell. Each control circuit is capable of emitting a signal representing physical parameters of its respective battery cell. There is a control unit to control the state of the battery on the basis of the signals representative of the physical parameters. There is a power bus electrically connecting said battery cells to one another in series and each control circuit delivers the representative signal via the power bus after reception of a synchronization signal received.

11 Claims, 2 Drawing Sheets

SYSTEM AND CORRESPONDING METHOD FOR MANAGING A BATTERY COMPRISING A PLURALITY OF BATTERY CELLS

RELATED APPLICATIONS

This is the national stage, under 35 USC 371, of PCT application PCT/FR2015/050093, filed on Jan. 15, 2015, which claims the benefit of the Jan. 30, 2014 priority date of French Application 1450728, the content of which is herein incorporated by reference.

FIELD OF INVENTION

The invention concerns batteries formed by the assembly of a plurality of cells in series, the management of these batteries, and in particular the communication of information relating to the voltages across the terminals of the cells.

BACKGROUND

Such batteries can be used in electric drive or hybrid automotive vehicles, or in other types of systems that have a battery on board.

In general, for these applications, very high capacity batteries are used that are capable of delivering several tens of amp hours, with a very high voltage across their terminals, for example of the order of 400 volts. In order to obtain such high voltage values, cells each having a voltage of the order of a few volts are assembled in series. These cells can constitute a module (of variable size) or the whole of the battery.

Conventionally, the cells are monitored in order to ensure that the voltage across the terminals of these cells is in the nominal voltage range of the module or of the battery. Specifically, it is advisable to check that the voltage across the terminals of a cell is not too low in order to avoid deteriorations in the cell, and it is also advisable to check that the voltage across the terminals of a cell is not too high in order to avoid both deteriorations in the cell and also fires and explosions in the cell.

Therefore, means for measuring the voltage across the terminals of the cells forming a battery are used. These measuring means are powered directly by the cell for which they measure the voltage(s). The measured voltage value is then communicated to a central processing unit, or electronic control unit, that can also send commands to means that are intended to balance a cell. For this reason, at least two separate connections are used between each cell and the central processing unit.

As will be understood, since the voltage means are powered directly by the cells or the modules, and the central processing unit is powered by other sources of electric power, it is necessary to use insulating means in each connection between the cell or the module and the central processing unit. It is also possible to use insulating means between each connection from a cell or a module to a databus communicating with the central processing unit. Optocouplers, or even magnetic galvanic isolators, are generally used in order to obtain electrical insulation.

It may be noted that many components are used, particularly two insulating means per cell or per module. The increase in the number of components renders implementation of the system more complex, and it increases the cost of battery management systems.

In view of the above, the aim of the invention is to allow a simpler battery management system to be obtained that uses fewer components and that has lower cost.

SUMMARY

The subject of the invention is therefore a system for managing a battery comprising a plurality of battery cells connected in series, this system comprising:
a plurality of control circuits, each electrically connected in parallel with a cell of a battery and at least one electrical connection between a first control circuit of a first cell and a second control circuit of a second cell, each control circuit being capable of emitting a signal that is representative of physical parameters of the battery cell with which said control circuit is connected in parallel;
a control unit capable of controlling the state of the battery on the basis of the signals that are representative of the physical parameters of each of said cells of said battery;
a power bus electrically connecting said battery cells to one another in series;
each control circuit being configured to deliver said representative signal to the control unit by means of the power bus and only after reception of a synchronization signal received on the electrical connection of this control circuit.

According to another embodiment, each control circuit:
has a unique identifier allowing this control circuit to be distinguished from one of the other control circuits;
is configured to deliver said representative signal to the control unit only when the synchronization signal received on the electrical connection has said unique identifier of this control circuit.

According to another embodiment:
the first control circuit is configured to:
deliver the signal that is representative of physical parameters of the first cell to the control unit only after reception of a first synchronization signal emitted by the control unit, then,
once said representative signal has been delivered, emit a second control signal on the electrical connection;
the second control circuit is moreover configured to deliver the signal that is representative of physical parameters of the second cell to the control unit only after reception of the second synchronization signal by means of the electrical connection.

According to another embodiment, the first control circuit comprises means for transmitting a signal through said electrical connection, the second control circuit comprises means for receiving the signal from said connection.

According to another embodiment, the digital signal has at least information relating to the voltage across the terminals of at least one battery cell.

According to another aspect, the invention concerns a method for managing a battery comprising a plurality of battery cells arranged in series, this method comprising:
the provision of a battery and of a system for managing the battery having:
a plurality of control circuits, each electrically connected in parallel with a cell of the battery and at least one electrical connection between a first control circuit of a first cell and a second control circuit of a second cell, each control circuit being capable of emitting a signal that is representative of physical parameters of the battery cell with which said control circuit is connected in parallel;

a power bus electrically connecting said battery cells to one another in series:

the transmission, by a control unit of the battery, of a first synchronization signal to the first control circuit;

the emission, by the first control circuit, and only after having received the first synchronization signal, of a signal that is representative of physical parameters of the first battery cell to said control unit and by means of the power bus;

the transmission of a second synchronization signal, by the first control circuit, to the second control circuit;

the emission, by the second control circuit, and only after having received the second synchronization signal, of a signal that is representative of physical parameters of the second battery cell to said control unit and by means of the power bus.

According to another embodiment, the digital signal has at least information relating to the voltage across the terminals of at least one battery cell.

According to another embodiment, the method involves an adaptation of the electrical voltage of the digital signal to the second control circuit and/or an adaptation of the electrical voltage of the additional digital signal to the first control circuit.

According to another embodiment, the method involves an analogue/digital conversion in order to deduce the voltage level across the terminals of at least one cell from the digital signal and/or from the additional digital signal.

Other aims, features and advantages of the invention will emerge upon reading the description below, provided solely by way of nonlimiting example written with reference to the appended drawings, in which:

BRIEF DESCRIPTION OF THE DRAWINGS

FIG. 1 represents
an electrical battery 1, having n battery cells 2, where n is an integer strictly greater than 1, and
a battery management system 100.

DETAILED DESCRIPTION

Figure 1:
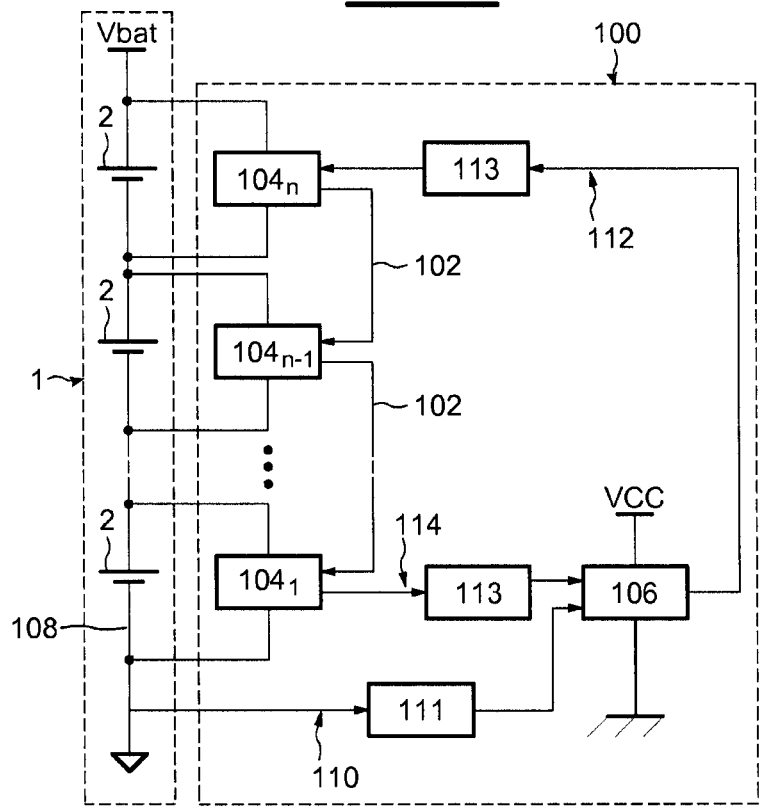
FIGS. 1 and 3 schematically represent two embodiments of a system for managing an electrical battery.

The voltage across the terminals of the battery 1 is denoted Vbat. Each cell 2 can comprise a plurality of individual battery cells. By way of example, the battery 1 may be intended to supply electric power to an electric drive or hybrid automotive vehicle engine. Thus, the battery 1 may have a voltage Vbat of the order of 400 volts.

The system 100 in this case has:
a number n of control circuits $104_1$ to $104_n$;
electrical connections 102;
a control unit 106;
a power bus 108.

The system 100 is connected at multiple points to the battery 1. More precisely, each of the control circuits $104_1$ to $104_n$ is connected in parallel with one of the n cells 2 and is configured to:

collect data for physical parameters of the cell 2 to which it is connected, then to emit a signal that is representative of these physical parameters, also called a data signal.

To this end, the control circuits $104_1$ to $104_n$ comprise means for measuring physical parameters of the cells 2 to which they are connected, means for processing digital signals being received and being transmitted, and possibly analogue/digital conversion means in order to obtain values of the physical parameters from any signal entering the control circuit.

This description defines the physical parameters of a cell 2 as being physical quantities that are characteristic of the physical state of this cell 2. By way of example, these physical parameters comprise the temperature of the cell 2, the impedance of the cell 2, the electric current provided by the cell 2, the voltage across the terminals of the cell 2. By way of example, the physical parameters of a cell 2 are determined by means of physical quantities measured at the terminals of the cell 2 by the control circuit to which it is connected.

The electrical connections 102 each allow communication, by transmission of a signal, between two of the circuits $104_1$ to $104_n$ that are immediately next to one another. By way of example, a connection 102 electrically connects the circuit $104_n$ to the circuit $104_{n-1}$. The circuit $104_{n-1}$ is itself electrically connected to the circuit $104_{n-2}$ by means of another exemplar of a connection 102. The circuits $104_1$ to $104_n$ are thus all connected to one another step by step. The connections 102 therefore form, in this case, a databus allowing the circuits $104_1$ to $104_n$ to interchange data. It is by no means necessary to provide an insulating device within each electrical connection 102, since the two circuits $104_1$ to $104_n$ are powered by adjacent cells 2, and the voltage across their terminals is generally similar.

The circuits $104_1$ to $104_n$ are moreover configured to deliver the representative signal to the control unit 106, by means of a bus 108, and only after reception of a synchronization signal. The nature of the synchronization signal will be described in more detail below. In this case, each circuit $104_1$ to $104_n$ has interfaces for receiving and emitting a synchronization signal, and an interface for electrical connection to a cell 2.

The control circuits are numbered consecutively from 1 to n. The n-th circuit bears the digital reference $104_n$. $104_i$ will be used to denote a circuit generically referring to any one of the circuits $104_1$ to $104_n$. The control circuits are in this case ordered from n to 1. Thus, it will be said that the circuit $104_{n-1}$ is the circuit following the circuit $104_n$. In this case, $104_n$ is the name given to the control circuit associated with the cell 2 corresponding to the highest electrical potentials of the battery 1, and $104_1$ is the name given to the circuit associated with the cell 2 corresponding to the lowest electrical potentials of the battery 1.

The direction of communication of the electrical connection 102 between two circuits is in this case indicated by an arrow in FIG. 1 pointing from the circuit situated toward the highest electrical potential of the battery 1 toward the one that presents a lower electrical potential.

The bus 108 has an electrical power link that electrically connects the n cells 2 which form the battery 1 to one another and in series. This bus 108 is moreover configured to allow the transport of data signals by means of power line communication techniques. To this end, the unit 106 and the circuits $104_1$ to $104_n$ have power line communication transmission means. In particular, each of the circuits $104_1$ to $104_n$ is in this case capable of delivering a data signal on this bus 108, for example by means of the electrical connections connecting each circuit to the terminals of a cell 2.

The control unit 106 is in this case capable of supervising the operation of the system 100. By way of example, the unit 106 is powered by another supply system (providing the supply voltage VCC). This unit 106 can process the information relating to the voltage levels of the batteries.

The unit 106 is particularly configured to:
deliver a synchronization signal to the circuits 104$_i$, and
collect the data signals emitted by the control circuits on the bus 108.

To this end, the unit 106 is electrically connected:
to the bus 108, by means of a connection 110 that can be fitted with an insulating device 111;
to the input interface of the circuit 104$_n$ by means of a connection 112 and to the output interface of the circuit 104$_1$ by means of the connection 114, these connections 112 and 114 in this case being of wired type and themselves also each being able to be fitted with an insulating device 113, which is identical to the device 111, for example.

The connection 110 is capable of transmitting information from the control circuits (in this case through the control circuit 104$_1$) to the control unit 106. The connection 112, for its part, also allows transmission of information from the control unit to the control circuits (in this case through the control circuit 104$_n$).

In this embodiment, each circuit 104$_i$ is moreover configured to
deliver on the bus 108 the data signal from the cell 2 to which it is connected, only after having received a synchronization signal delivered by the immediately preceding control circuit (or, in the case of the circuit 104$_n$, delivered by the unit 106) and, in this case, only until this control circuit has delivered a synchronization signal;
once the data signal has been delivered, emit a synchronization signal to the circuit 104$_{n-1}$ by means of the connection 102 that connects it to the reception interface of the circuit 104$_{n-2}$ (or, in the case of the circuit 104$_1$, to the unit 106). This emitted synchronization signal is identical to the received signal, for example.

Figure 2:
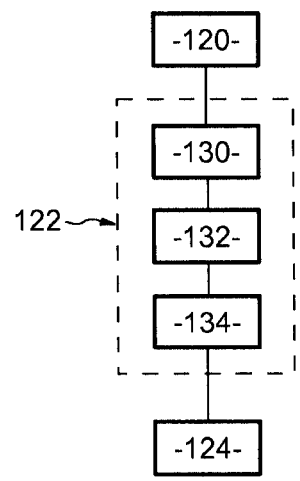
FIG. 2 is a flowchart for a method for using the system for managing a battery from FIG. 1 or from FIG. 3.

FIG. 2 describes an example of use of the system 100 to collect physical parameters on the cells 2 forming the battery 1.

In a step 120, the unit 106 emits a synchronization signal in order to selectively trigger emission of the data signals by each of the control circuits. In this case, the synchronization signal is emitted and then transmitted to the circuit 104$_n$ by means of the connection 112, via the insulating device 113. The form of the synchronization signal is preferably chosen in order to be transmitted rapidly from one control circuit to the other.

Next, in a step 122, the control circuits alternately emit the respective data signals on the bus 108 as the synchronization signal progresses from one control circuit to the other. The detail of this step 122 is explained in more detail below.

By way of example, in an operation 130, the synchronization signal is received by the circuit 104$_n$ on its input interface.

Next, in an operation 132, the circuit 104$_n$ measures the physical parameters of the cell 2 to which it is connected, and then generates a data signal that is representative of the measured physical parameters. This data signal is then emitted on the bus 108. In this case, this data signal is transmitted by modulating the voltage of the cell 2 to which the circuit 104$_n$ is connected.

Next, in an operation 134, the circuit 104$_n$ emits a synchronization signal on its output interface, to the subsequent circuit 104$_i$. In this case, the synchronization signal is emitted only at the conclusion of a predetermined time after the data signal has finished being emitted on the bus 108.

The operations 130 to 134 are then repeated sequentially for each of the subsequent circuits 104$_i$. For the circuit 104$_1$, the synchronization signal emitted during the operation 134 is emitted to the unit 106 by means of the connection 114, via the insulating device 113.

Thus, each circuit 104$_i$ is able to emit the data signals from its respective cell 2 only during a time window that is delimited by emission and reception of the control signal. These data signals cannot be emitted until after the synchronization signal has been received. They also cannot be emitted after this control circuit has in turn emitted the synchronization signal to the subsequent control circuit. The synchronization signal can thus be likened to a synchronization token that is alternately held by each of the circuits 104$_i$, each of which cannot emit a data signal until it is in possession of this synchronization token. Two separate circuits 104$_i$ cannot hold this synchronization token simultaneously.

During step 122, the unit 106 collects the data signals that are alternately emitted on the bus 108 by each circuit 104$_i$. These signals are in this case collected by means of the connection 110. More exactly, this collection moreover involves measurement of the potential difference between Vbat and the ground of the circuit, by means of a connection that is not represented in FIG. 1.

Finally, in a step 124, the unit 106 receives the synchronization signal emitted by the circuit 104$_1$ and stops collecting the data on the bus 108. At the conclusion of step 134, the unit 106 has received the data signals sent by each circuit 104$_i$, and thus has information about the physical state of the cells 2 forming the battery 1.

Use of the power bus 108 to convey the signals that are representative of physical parameters to the unit 106 allows the data to be sent at a higher speed in relation to the use of the single connections 102. This also increases redundancy for the communication means, because the data emitted by the circuits 104$_i$ (and in particular urgent data relating to safety, such as a warning signal indicating abnormal heating in one of the cells 2) can be transmitted to the unit 106 even when the connections 102 are inoperative or destroyed.

Moreover, by using a synchronization signal on the connections 102 in order to control the timing of emission of the data signals by the circuits 104$_i$, the risk of data collision on the bus 108 is limited without the need to use special encoding of the data signals (such as the Kasami code), which would give rise to an additional cost for the system 100. Thus, the reliability of communications between the circuits 104$_i$ and the unit 106 is improved at a lower cast. Data collision refers to the case in which two circuits 104$_i$ each emit data simultaneously on the same databus 108, thus rendering these data unreadable by the unit 106.

Figure 3:
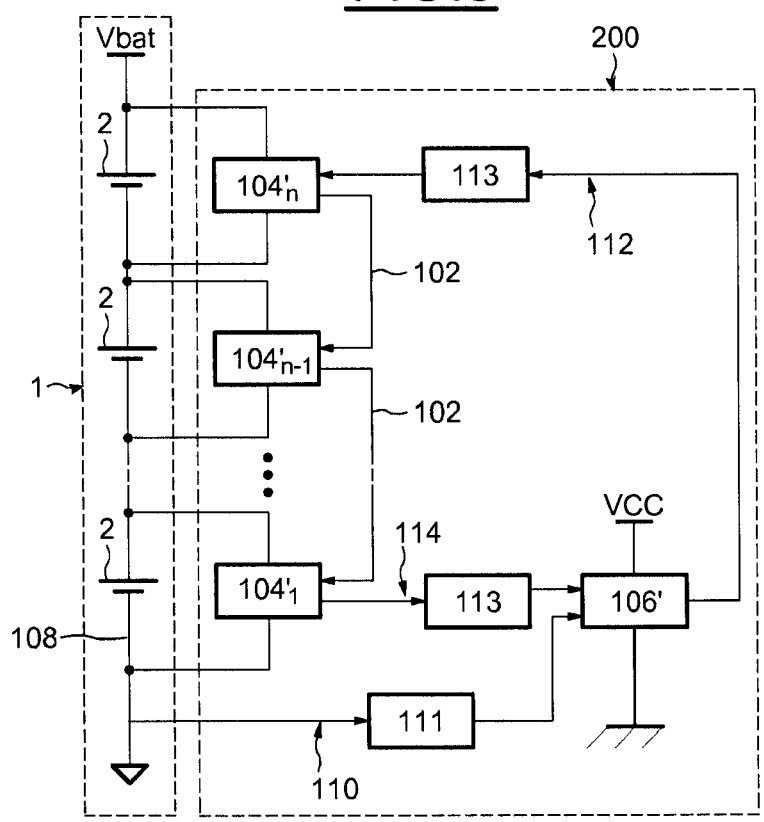

FIG. 3 represents a system 200 for managing the battery 1, which is similar to the system 100, except that the synchronization signal plays a different part. In this embodiment, the function of the system 200 is to collect information relating to a single cell 2, called the target cell.

By way of example, this system 200 is identical to the system 100, except that:
the circuits 104$_1$ to 104$_n$ are replaced by circuits 104'$_1$ to 104'$_n$, respectively, which are identical thereto, except that they each have a unique identifier and are configured to emit the data signal only when the synchronization signal received has the unique identifier of this circuit;
the unit 106 is replaced by a unit 106', which is identical thereto, except that it is capable of emitting a synchronization signal having the identifier of the circuit $104'_i$ that is connected to the target cell.

By way of example, the identification of each of the circuits $104'_i$ is implemented by means of an identification device having, by way of example, the identification circuit as described in the patent application FR2986392 with reference to FIGS. 2 to 5 of that application. By way of example, this identification circuit has an RFID (Radio Frequency Identification Device) tag that is devoid of its radio antenna.

By way of example, the use of this system 200 involves steps 130, 132 and 134, except that, for each circuit $104'_i$:
the operation 132 is executed by the circuit $104'_i$ only when the synchronization signal received in the operation 130 has the unique identifier of this circuit $104'_i$; otherwise, the operation 134 is implemented directly;
the synchronization signal emitted in the operation 134 is identical to that received in the operation 130.

Numerous other embodiments are possible.

As a variant, the circuits $104_1$ to $104_n$ are also capable of transmitting a state indicator for the cells 2 to which they are respectively connected, this state indicator being determined from these physical quantities. By way of example, this state indicator is an alarm indicating that a predetermined threshold has been exceeded for one or more of these physical quantities.

The direction of communication of the connection 102 between two circuits may be different, for example may be directed from the circuit that has the lowest electrical potential to the one that has the highest potential.

The functionalities of the system 100 and 200 may be combined within one and the same system. The control circuits and the control unit are then configured accordingly.

As a variant, the system 200 can collect the physical data for more than one cell 2. In this case, the synchronization signal has the unique identifiers of each of the circuits $104'_i$ associated with the target cells from which the physical parameters are desired to be known. In order to limit the risk of data collision on the bus 108, the synchronization signal has synchronization information, for example constraining each circuit $104'_i$ to a predefined waiting time between reception of the synchronization signal and the moment at which the data signal can be emitted by this circuit $104'_i$. The unit 106' and the circuits $104'_1$ to $104'_n$ are then modified accordingly in order to process this synchronization signal.

As a variant, two synchronization signals can be emitted successively by the unit 106', which are intended for different circuits $104'_i$, and each have an identifier of the circuit $104'_i$ for which it is intended. The circuits $104'_i$ are then modified accordingly, in order each to deliver to the bus 108 a data signal modulated at a different frequency. In other words, the data signals emitted by each of these circuits $104'_i$ travel on the bus 108 by power line communication at different frequencies. These data signals can thus be transmitted simultaneously on the bus 108. The unit 106' is then configured to collect and process these data signals.

As a variant, the unit 106 is also capable of providing the control circuits $104_i$ with balancing instructions for the cells 2, by using the electrical connections 110 and 112 in particular. Thus, it is not necessary to use an additional electrical connection between the voltage measuring means of each cell and a control unit, and it is also not necessary to use a large number of insulating devices. Only two connections fitted with the insulating devices 111 and 113 are necessary.

The invention is particularly useful for automotive vehicles.

The invention claimed is:

1. An apparatus for managing a battery comprising a plurality of battery cells connected in series, said apparatus comprising a plurality of control circuits, each electrically connected in parallel with a cell of a battery and at least one electrical connection between a first control circuit of a first cell and a second control circuit of a second cell, each control circuit being capable of emitting a signal that is representative of physical parameters of the battery cell with which said control circuit is connected in parallel, a control unit capable of controlling the state of the battery on the basis of the signals that are representative of the physical parameters of each of said cells of said battery, and a power bus electrically connecting said battery cells to one another in series, wherein each control circuit is configured to deliver said representative signal to the control unit via the power bus only after having received a synchronization signal on the electrical connection of the control circuit.

2. The apparatus of claim 1, wherein each control circuit has a unique identifier allowing said control circuit to be distinguished from one of the other control circuits and wherein each control circuit is configured to deliver said representative signal to the control unit only when the synchronization signal received on the electrical connection has said unique identifier of said control circuit.

3. The apparatus of claim 1, wherein the first control circuit is configured to deliver the signal that is representative of physical parameters of the first cell to the control unit only after reception of a first synchronization signal emitted by the control unit, then, once said representative signal has been delivered, to emit a second control signal on the electrical connection, and wherein the second control circuit is configured to deliver the signal that is representative of physical parameters of the second cell to the control unit only after having received a second synchronization signal via the electrical connection.

4. The apparatus of claim 1, wherein the first control circuit comprises means for transmitting a signal through said electrical connection and wherein the second control circuit comprises means for receiving the signal from said connection.

5. The apparatus of claim 1, wherein the signal that is representative of physical parameters of the battery cell is a digital signal that has at least information relating to the voltage across the terminals of at least one battery cell.

6. A method comprising managing a battery comprising a plurality of battery cells arranged in series, wherein managing said battery comprises providing a battery and an apparatus for managing the battery, said apparatus comprising a plurality of control circuits, each electrically connected in parallel with a cell of the battery and at least one electrical connection between a first control circuit of a first cell and a second control circuit of a second cell, each control circuit being capable of emitting a signal that is representative of physical parameters of the battery cell with which said control circuit is connected in parallel, and a power bus electrically connecting said battery cells to one another in series causing a control unit of the battery to transmit a first synchronization signal to the first control circuit; causing the first control circuit to emit, only after having received the first synchronization signal, a signal that is representative of physical parameters of the first battery cell to said control unit and via the power bus; causing the first control circuit to transmit a second synchronization signal to the second control circuit, and causing the second control circuit to emit, only after having received the second synchronization signal, a signal that is representative of physical parameters of the second battery cell to said control unit and via the power bus.

7. The method of claim 6, wherein the signal that is representative of physical parameters of the battery is a digital signal that has at least information relating to the voltage across the terminals of at least one battery cell.

8. The method of claim 6, wherein the signal that is representative of physical parameters of the battery is a digital signal, and wherein said method further comprises adapting the electrical voltage of the digital signal to the second control circuit.

9. The method of claim 6, further comprising carrying out an analog-to-digital conversion in order to deduce the voltage level across the terminals of at least one cell from the digital signal.

10. The method of claim 6, wherein the signal that is representative of physical parameters of the battery is a digital signal, said method further comprising adapting the electrical voltage of an additional digital signal to the first control circuit.

11. The method of claim 6, further comprising carrying out an analog to digital conversion in order to deduce the voltage level across the terminals of at least one cell from an additional digital signal.

* * * * *